(12) United States Patent
Tanaya (10) Patent No.: US 7,368,861 B2
(45) Date of Patent: May 6, 2008

(54) PIEZOELECTRIC RESONATOR ELEMENT AND PIEZOELECTRIC DEVICE

(75) Inventor: Hideo Tanaya, Nagano (JP)

(73) Assignee: Seiko Epson Corporation (JP)

( * ) Notice: Subject to any disclaimer, the term of this patent is extended or adjusted under 35 U.S.C. 154(b) by 308 days.

(21) Appl. No.: 11/234,741

(22) Filed: Sep. 23, 2005

(65) Prior Publication Data
US 2006/0066185 A1 Mar. 30, 2006

(30) Foreign Application Priority Data

| Sep. 24, 2004 | (JP) | ............................. 2004-277293 |
| Oct. 25, 2004 | (JP) | ............................. 2004-309137 |
| Apr. 27, 2005 | (JP) | ............................. 2005-129910 |

(51) Int. Cl.
*H03H 9/21* (2006.01)
*H03H 9/215* (2006.01)

(52) U.S. Cl. .................................................. 310/370

(58) Field of Classification Search ................ 310/370; 73/504.02; 331/156
See application file for complete search history.

(56) References Cited

U.S. PATENT DOCUMENTS

| 2,247,960 A | 7/1941 | Michaels |
| 4,191,906 A | 3/1980 | Kogure |
| 6,587,009 B2 * | 7/2003 | Kitamura et al. ............ 331/158 |
| 2002/0113527 A1 * | 8/2002 | Kawashima ................ 310/370 |
| 2004/0154395 A1 * | 8/2004 | Kikuchi et al. ............ 73/503.3 |
| 2005/0116586 A1 * | 6/2005 | Tanaya et al. ............... 310/348 |

FOREIGN PATENT DOCUMENTS

| EP | 1 085 654 | 3/2001 |
| EP | 1 174 684 | 1/2002 |
| JP | 55-109925 | 8/1980 |
| JP | 2001-133269 | 5/2001 |
| JP | 2002-261575 | 9/2002 |
| JP | 2005-354649 | 12/2005 |
| WO | WO 96/26445 | 8/1996 |

OTHER PUBLICATIONS

Patent Abstracts of Japan re: Publication No. 2003069375.
Communication from European Patent Office re: related application, Jan. 24, 2006.

* cited by examiner

*Primary Examiner*—J. San Martin
(74) *Attorney, Agent, or Firm*—Harness, Dickey & Pierce, P.L.C.

(57) ABSTRACT

A piezoelectric resonator element includes a base portion formed of a piezoelectric material, a plurality of resonating arms formed integrally with the base portion and extending parallel to each other, a longitudinal groove formed along a longitudinal direction of each of the resonating arms, and an electrode for driving formed in the longitudinal groove. A width of each of the resonating arms is gradually decreased from the base portion toward a tip of the resonating arm, and a change point of width variation is provided close to the tip of the resonating arm. The width variation shifts from decrease to increase at the change point. The change point is located closer to the tip of the resonating arm than an end of the longitudinal groove.

8 Claims, 8 Drawing Sheets

PIEZOELECTRIC RESONATOR ELEMENT AND PIEZOELECTRIC DEVICE

BACKGROUND

1. Technical Field

The present invention relates to improvements of a piezoelectric resonator element and a piezoelectric device housing a piezoelectric resonator element in a package or case.

2. Related Art

Piezoelectric devices, such as piezoelectric resonators and piezoelectric oscillators, have been widely used in small information apparatuses typified by HDDs (hard disk drives), mobile computers and IC cards, mobile communication apparatuses typified by cellular phones, car phones and paging systems, piezoelectric gyro sensors, and so on.

Figure 12:
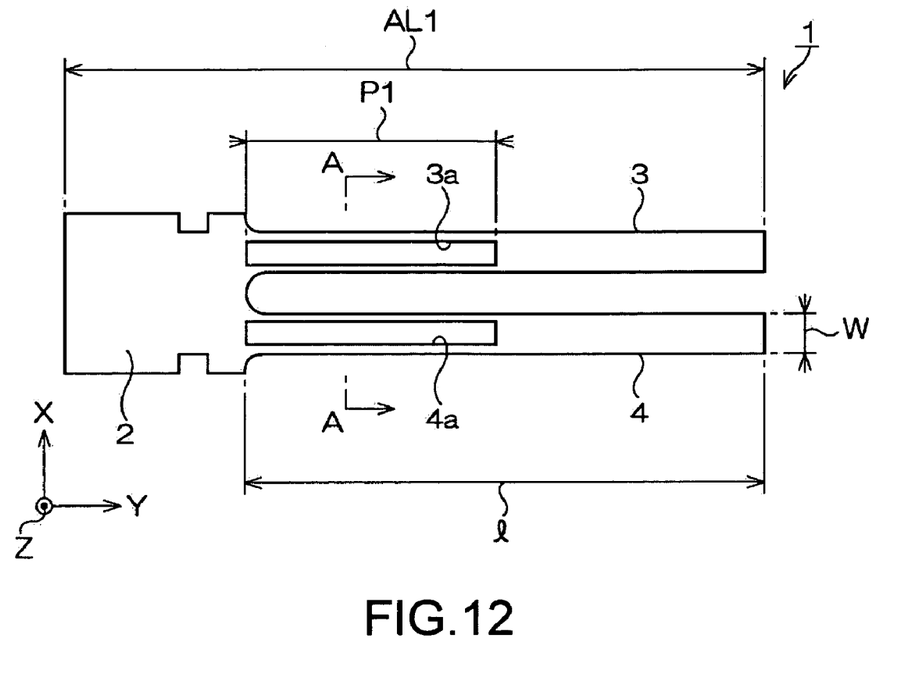
FIG. 12 is a schematic plan view of a typical piezoelectric resonator element.
Figure 13:
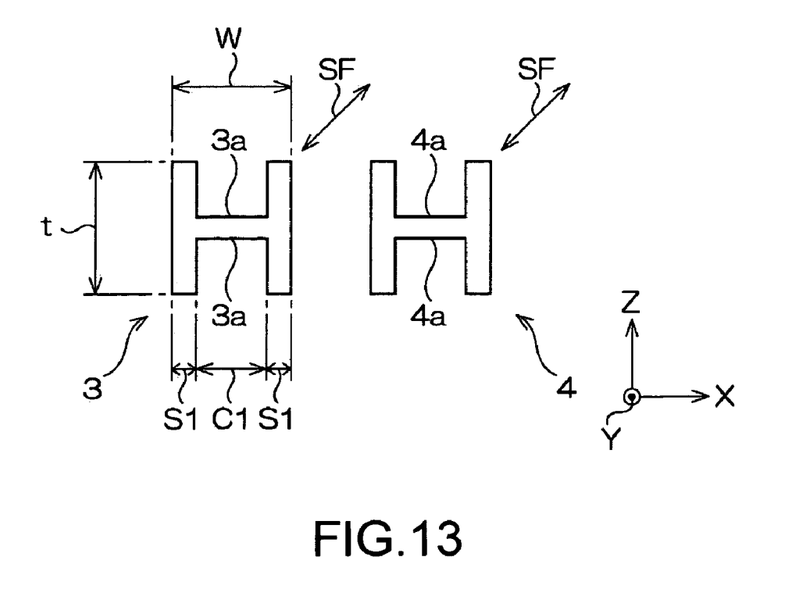
FIG. 13 is an end view cut along the line A-A of FIG. 12.

FIG. 12 is a schematic plan view illustrating one example of piezoelectric resonator elements that have been typically used for piezoelectric devices. FIG. 13 is an end view cut along the line A-A of FIG. 12.

Referring to the drawings, the outer shape of a piezoelectric resonator element 1 as a tuning fork type one is formed by etching a piezoelectric material such as quartz. The piezoelectric resonator element 1 includes a rectangular base portion 2 attached to a package (not shown in the drawing) or the like, and a pair of resonating arms 3 and 4 that are extended from the base portion 2 toward the right of the drawing. Longitudinal grooves 3a and 4a and necessary electrodes for driving are formed on the major surfaces (front and back surfaces) of these resonating arms. An example of documents describing the piezoelectric resonator element is JP-A-2002-261575.

In such a piezoelectric resonator element 1, upon application of a driving voltage thereto via the electrodes for driving, flexural vibration arises so that tips of the resonating arms 3 and 4 come close to and move away from each other. Thus, a signal of a certain frequency is extracted.

It has been desired for such a piezoelectric resonator element 1 to have a smaller size along with miniaturization of the above-described various products provided with a piezoelectric device utilizing the piezoelectric resonator element 1. Therefore, the piezoelectric resonator element 1 must be formed to have as small a size as possible, and it is desired for the total length AL1 of the piezoelectric resonator element 1 to be shortened in particular. In addition, since the miniaturization of the products has uninterruptedly progressed, a structure for allowing a smaller size is needed for the piezoelectric resonator element 1.

Here, the frequency f of the piezoelectric resonator element 1, which is a tuning fork type piezoelectric resonator element like that shown in the drawing, is proportional to $W/(l \times l)$ if the length and arm width of the resonating arms 3 and 4 are defined as l and W, respectively.

This means that, if the piezoelectric resonator element 1, which is elongated along one direction, is to be miniaturized and thus the magnitude of the total length AL1 in FIG. 12 is to be decreased, shortening the length l of the resonating arms leads to an increase of the frequency. Furthermore, if the width W of the resonating arms is decreased, the frequency is lowered. Thus, in order to achieve miniaturization while maintaining the frequency, the arm width W must be decreased while the length of the resonating arms is shortened to some extent.

In miniaturization of the piezoelectric resonator element 1, in order to maintain, for example, a frequency of 32 kHz (32.768 kHz), which is a typical frequency, it is required that the length l of the resonating arms 3 and 4 is shortened and the arm width W is decreased. However, in processing the small piezoelectric resonator element 1, if the piezoelectric resonator element 1 is to be processed to have the small arm width w in particular while maintaining the characteristics of the element 1, the following difficulties arise.

Specifically, the difficulties result from a need to process longitudinal grooves 3a and 4a like those shown in FIG. 13 in the resonating arms 3 and 4. Referring to FIG. 13, the thickness t is difficult to change since it is restricted by conditions of a material, such as a quartz wafer, to be processed. Therefore, if the thickness t of a typical resonating arm is 100 μm for example, the thickness t of a miniaturized resonating arm should also be 100 μm.

In contrast to this, as for the arm width W, a miniaturized resonating arm may be required to have a width of about 50 μm although the arm width W of a typical resonating arm is 100 μm. For example, when the arm width is 100 μm, the groove width C1 is about 70 μm and the sidewall width S1 is about 15 μm. However, if the arm width W is about 50 μm, the groove width C1 must be reduced to about 40 μm and the sidewall width S1 must be reduced to about 5 μm, for example.

If such a piezoelectric resonator element is fabricated, the rigidity of the resonating arms 3 and 4 is significantly low. Therefore, in the above-described flexural vibration caused by application of a driving voltage, the amplitude in the Z direction in FIG. 13 is added, and thus the flexural vibration of the resonating arms 3 and 4 in the X-direction turns to flexural vibration shown by arrows SF with exaggeration.

Figure 14:
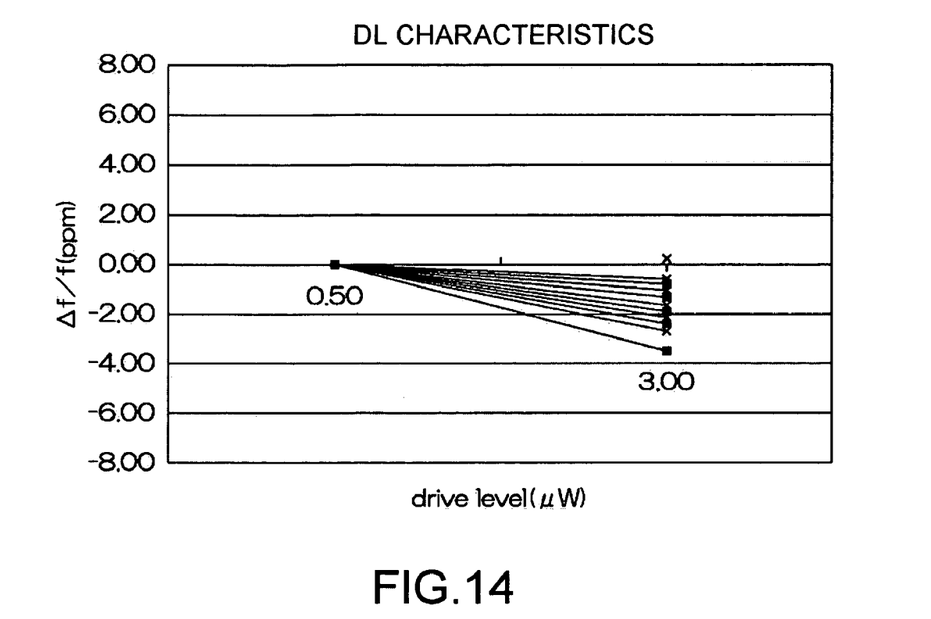
FIG. 14 is a graph illustrating drive level characteristics of the piezoelectric resonator element of FIG. 12.

FIG. 14 is a graph illustrating the drive characteristic of miniaturized piezoelectric resonator elements having a typical structure. As the level of a driving voltage is gradually increased along the abscissa of the graph, the frequency variation on the ordinate arises toward the negative direction. This shows that components of the Z-direction vibration of FIG. 13 increase and thus the energy loss of the vibration increases, which is a factor of an increase of the crystal impedance (CI) value.

Figure 15:
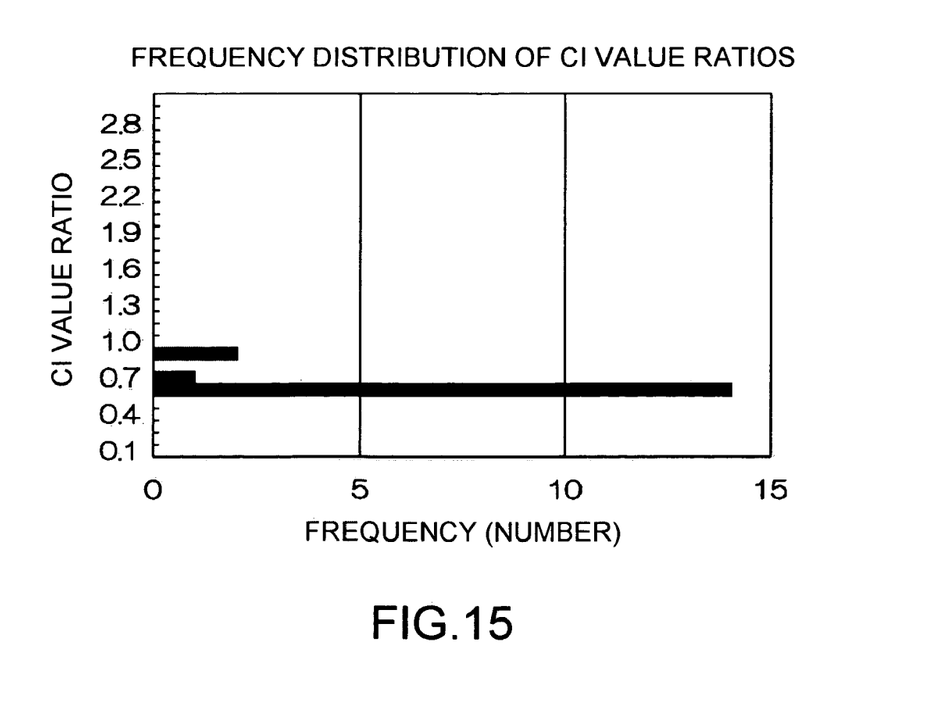
FIG. 15 is a graph illustrating variation of CI value ratios in the piezoelectric resonator element of FIG. 12.

As effective measures for suppressing the CI value, there is a method in which the longitudinal grooves 3a and 4a described for FIG. 12 are elongated and the formation area of the electrodes for driving is increased. However, a piezoelectric resonator element has plural vibration modes. The frequency of a typically used fundamental wave is 32.768 kHz for example. In contrast to this, the frequency of the second harmonic wave of the piezoelectric resonator element 1 is near 250 kHz. Elongating the longitudinal grooves 3a and 4a can lower the CI value of the fundamental wave. However, the CI value of the second harmonic wave is also lowered. Therefore, if a typical structure is used, many products suffer disadvantages that the CI value ratio, which is the ratio of the CI value of a harmonic wave to the CI value of the fundamental wave, is smaller than 1 as shown in FIG. 15 and thus oscillation easily arises not with the fundamental wave but with the second harmonic wave.

SUMMARY

An advantage of some aspects of the invention is to provide a piezoelectric resonator element in which, in miniaturization of a tuning fork type resonator element, movement of resonating arms in an unnecessary direction is suppressed to thereby suppress the CI value and prevent deterioration of vibration characteristics, and a piezoelectric device utilizing such a piezoelectric resonator element.

According to a first aspect of the invention, a piezoelectric resonator element includes a base portion formed of a piezoelectric material, a plurality of resonating arms formed integrally with the base portion and extending parallel to each other, a longitudinal groove formed along a longitudinal direction of each of the resonating arms, and an electrode for driving formed in the longitudinal groove. In the piezoelectric resonator element, a width of each of the resonating arms is gradually decreased from the base portion toward a tip of the resonating arm, and a change point of width variation is provided close to the tip of the resonating arm. The width variation shifts from decrease to increase at the change point. The change point is located closer to the tip of the resonating arm than an end of the longitudinal groove.

According to the configuration of the first aspect, in the case of forming electrodes for driving (excitation electrodes) in the longitudinal grooves formed in the resonating arms, the arm width is gradually decreased from the base portion toward the tip of the resonating arm, and a change point of the width variation in which the width variation shifts to increase is provided close to the tip. Thus, oscillation with the second harmonic wave can be prevented while the CI value is suppressed. In this case, on the premise of the fact that the length, arm width and so on of the resonating arms are not uniform, depending on a piezoelectric resonator element, by positioning the change point closer to the resonating arm tip than an end of the longitudinal groove, a piezoelectric resonator element in which the CI value is suppressed and vibration characteristics are not deteriorated can be provided.

In the piezoelectric resonator element, it is preferable that each of the resonating arms includes a first width-decreasing part, near a root of the resonating arm to the base portion, in which the width of the resonating arm is sharply decreased from the root toward the tip of the resonating arm, and a second width-decreasing part in which the width of the resonating arm is gradually decreased from an end of the first width-decreasing part toward the tip of the resonating arm.

According to the configuration, the second width-decreasing part is provided in which the arm width of the resonating arm is gradually decreased from an end of the first width-decreasing part toward the tip of the resonating arm, and a change point of width variation in which the width variation turns to increase is provided close to the tip. Thus, oscillation with the second harmonic wave can be prevented while the CI value is suppressed.

Furthermore, the first width-decreasing part in which the width is sharply decreased toward the tip of the resonating arm is included near a root of the resonating arm to the base portion. Therefore, the rigidity of the root part, at which the largest stress acts and thus the strain is large when the resonating arm flexurally vibrates, can be enhanced. Thus, flexural vibration of the resonating arm is stabilized and vibration components of an unnecessary direction are suppressed. Therefore, the CI value can be further reduced. That is, in miniaturization of a piezoelectric resonator element, stable flexural vibration can be realized and the CI value can be suppressed.

In the piezoelectric resonator element, it is preferable that the base portion has a notch formed by decreasing a width of part of the piezoelectric material and being spaced from a root of each of the resonating arms by a distance that is equal to or larger than 1.2 times the width of the resonating arm.

In consideration of the fact that, in flexural vibration of resonating arms of a tuning fork type resonator element, the region to which the vibration leakage is transmitted correlates with the arm width of the resonating arms, the present inventors have obtained the knowledge that notches of typical piezoelectric resonator elements are not provided at proper positions. Consequently, according to the configuration, the positions at which the notches are provided are set to places spaced from the roots of the resonating arms by a distance that is above the arm width of the resonating arm. Thus, the notches provide a structure allowing further ensured suppression of transmission of the vibration leakage from the resonating arms to the base portion. Thus, the vibration leakage from the resonating arms to the base portion can be prevented adequately, and therefore a piezoelectric resonator element having favorable drive level characteristics can be provided.

In particular, it has been confirmed that the drive level characteristic can be adjusted to the level of a normal piezoelectric resonator element by forming the notches at positions spaced from the root by a distance at least 1.2 times the arm width.

In the piezoelectric resonator element, it is preferable that an irregularly-shaped part projecting toward a positive X-axis (electric axis) direction is formed on a side surface of each of the resonating arms so that a size of the irregularly-shaped part is minimized.

According to the configuration, in the case of forming the outer shape of a piezoelectric resonator element by wet-etching, the irregularly-shaped part generated due to etching anisotropy is formed so that the size of thereof is minimized. Therefore, flexural vibration of the resonating arm can be stabilized.

In the piezoelectric resonator element, it is preferable that a ratio of a maximum width of the resonating arm to a minimum width of the resonating arm, as an arm width decreasing ratio of the resonating arm, is determined in relation to a ratio of a length of the longitudinal groove to an arm length of the resonating arm, as a groove length ratio.

According to the configuration, a piezoelectric resonator element has a structure in which a ratio of a maximum width of the resonating arm to a minimum width of the resonating arm, as an arm width decreasing ratio of the resonating arm, is determined in relation to a ratio of a length of the longitudinal groove to an arm length of the resonating arm, as a groove length ratio. Thus, a piezoelectric resonator element can be provided in which in miniaturization of the entire structure, the CI value is suppressed and vibration characteristics are not deteriorated.

In the piezoelectric resonator element, it is preferable that, if the groove length ratio is set to about 61 percent, the arm width decreasing ratio is set equal to or larger than 1.06.

According to the configuration, in the case of setting the groove length ratio to 61 percent for example, the arm width decreasing ratio is set equal to or larger than 1.06. Thus, a piezoelectric resonator element can be obtained that sufficiently suppresses the CI value of the fundamental wave and simultaneously has a reduced tendency of oscillation with the second harmonic wave.

In the piezoelectric resonator element, it is preferable that a width of the first width-decreasing part is equal to or larger than 11 μm.

According to the configuration, by setting the width of the first width-decreasing part equal to or larger than 11 μm, the CI value can significantly be reduced.

A piezoelectric device according to a second aspect of the invention houses a piezoelectric resonator element in a package or a case. The piezoelectric resonator element includes a base portion formed of a piezoelectric material, a plurality of resonating arms formed integrally with the base portion and extending parallel to each other, a longitudinal groove formed along a longitudinal direction of each of the resonating arms, and an electrode for driving formed in the longitudinal groove. In the piezoelectric resonator element, a width of each of the resonating arms is gradually decreased from the base portion toward a tip of the resonating arm, and a change point of width variation is provided close to the tip of the resonating arm. The width variation shifts from decrease to increase at the change point. The change point is located closer to the tip of the resonating arm than an end of the longitudinal groove.

According to the configuration of the second aspect, based on the same principle as the first aspect, the piezoelectric device can be provided in which in miniaturization of the device, stable flexural vibration can be realized and the CI value can be suppressed.

BRIEF DESCRIPTION OF THE DRAWINGS

The invention will be described with reference to the accompanying drawings, wherein like numbers refer to like elements.

DESCRIPTION OF EXEMPLARY EMBODIMENTS

Figure 1:
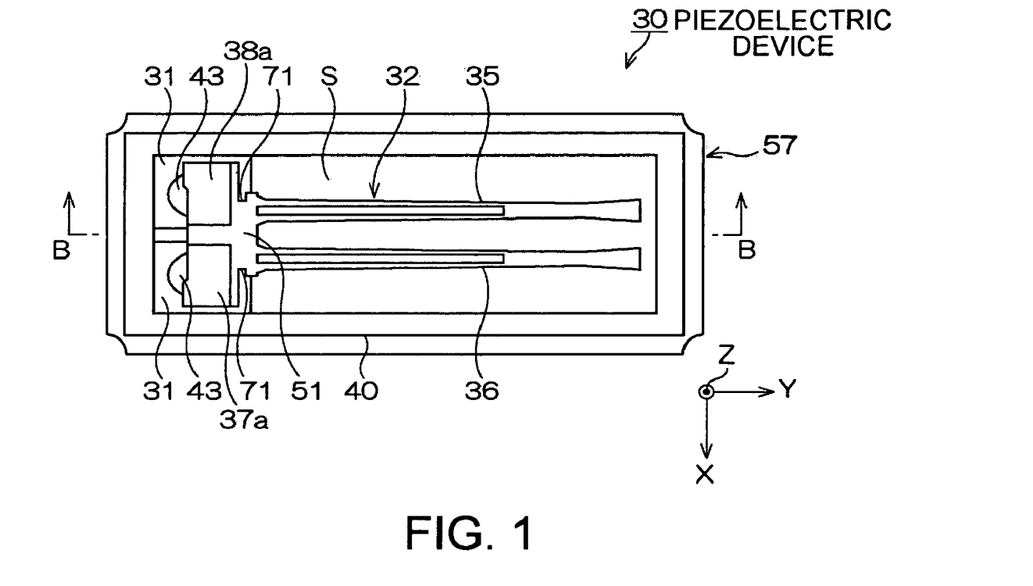
FIG. 1 is a schematic plan view illustrating an embodiment of a piezoelectric device of the present invention.
Figure 2:
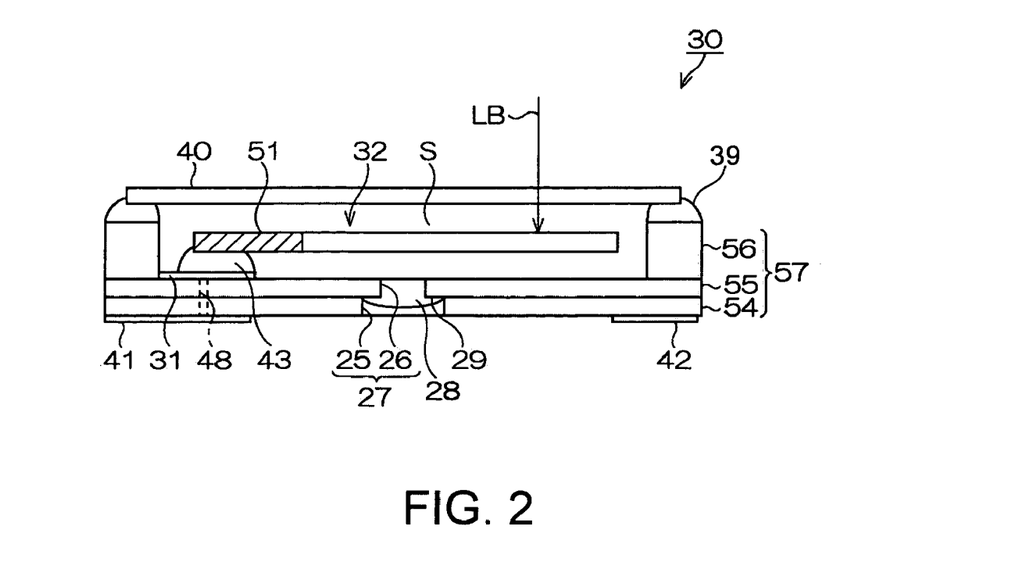
FIG. 2 is a schematic sectional view along the line B-B of FIG. 1.
Figure 3:
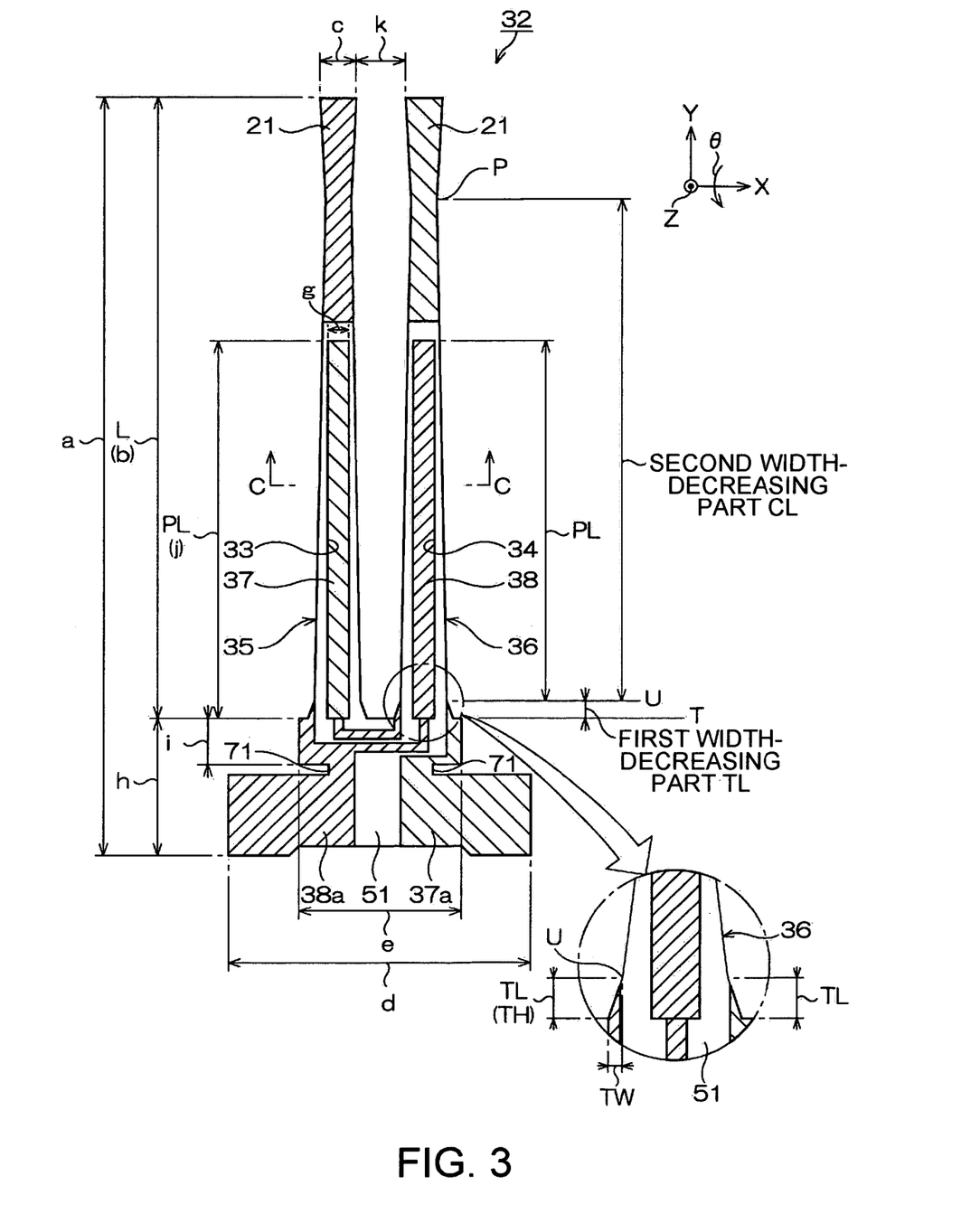
FIG. 3 is a schematic plan view of a piezoelectric resonator element used for the piezoelectric device of FIG. 1.
Figure 4:
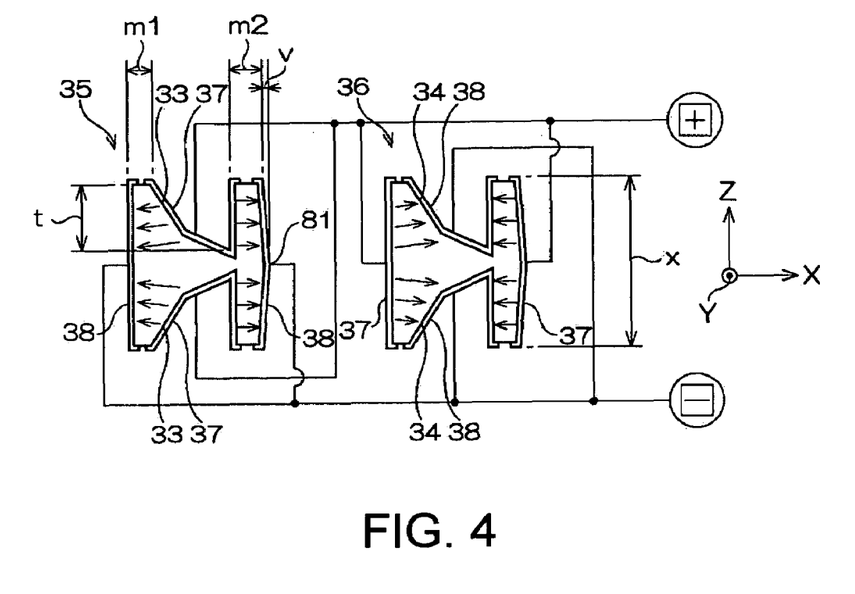
FIG. 4 is an end view cut along the line C-C of FIG. 3.

FIGS. 1 to 4 illustrate an embodiment of a piezoelectric device of the invention. FIG. 1 is a schematic plan view of the piezoelectric device. FIG. 2 is a schematic sectional view along the line B-B of FIG. 1. FIG. 3 is a schematic plan view illustrating an embodiment of a piezoelectric resonator element used in the piezoelectric device of FIG. 1. FIG. 4 is an end view cut along the line C-C of FIG. 3.

A package 57 is formed into a rectangular box shape for example as shown in FIGS. 1 and 2. Specifically, the package 57 is formed by stacking a first substrate 54, a second substrate 55 and a third substrate 56. For example, the package 57 is formed by forming a ceramic green sheet composed of aluminum oxide as an insulating material into the illustrated shape, and then sintering it.

The bottom of the package 57 has a through hole 27 for degassing in the manufacturing step. The through hole 27 is formed of a first hole 25 formed in the first substrate 54, and a second hole 26 formed in the second substrate 55. The second hole 26 has the outer diameter smaller than that of the first hole 25, and communicates with the first hole 25.

The through hole 27 is filled with a sealing material 28 to thereby be sealed so that the inside of the package 57 is hermetically-sealed.

In the package 57, the material of the inner side of the third substrate 56 is removed to thereby form an internal space S as shown in FIG. 2. This internal space S is a housing space for housing a piezoelectric resonator element 32. Over electrode portions 31 formed on the second substrate 55, extraction electrodes 37a and 38a provided on the base portion of the piezoelectric resonator element 32 are disposed and bonded to the electrode portions 31 with using conductive adhesives 43. The electrode portions 31 are coupled to mounting terminals 41 and 42 on the back surface of the package via conductive through holes or the like. The package 57 houses, in a vacuum state by use of a vacuum chamber or the like, the piezoelectric resonator element 32 and then is bonded to the lid 40 made of transparent glass by using a sealing material 39. Thus, the package 57 is hermetically sealed in a vacuum state. Accordingly, electrodes and so on of the piezoelectric resonator element 32 can be irradiated with a laser beam LB from the external and thereby can be trimmed after the sealing with the lid 40, which allows frequency adjustment.

Note that a metal plate composed of Kovar or the like can also be used for the lid 40. In this case, frequency adjustment of the piezoelectric resonator element 32 by irradiation with the laser beam LB from the external cannot be implemented.

The piezoelectric resonator element 32 is formed of quartz for example. Besides quartz, a piezoelectric material, such as lithium tantalate or lithium niobate, can be utilized. As shown in FIG. 3, the piezoelectric resonator element 32 includes a base portion 51 fixed to the package 57 and a pair of resonating arms 35 and 36 that are bifurcated and extend parallel to each other from the base portion 51 as a base end toward the upper side of the drawing.

Preferably, longitudinal grooves 33 and 34 extending in the longitudinal direction are formed on the front and back major surfaces of the resonating arms 35 and 36, respectively. As shown in FIGS. 3 and 4, excitation electrodes 37 and 38, which are electrodes for driving, are provided in the longitudinal grooves. Such a tuning fork outer shape of the piezoelectric resonator element 32 and the longitudinal grooves provided in the resonating arms can precisely be formed by, for example, wet-etching a material such as a quartz wafer with a fluorinated acid solution or the like, or dry-etching it.

The excitation electrodes 37 and 38 are formed in the longitudinal grooves 33 and 34 and on the side surfaces of each resonating arm so that the electrode in the longitudinal groove and the electrode provided on the side surface form a couple in each resonating arm. The excitation electrodes 37 and 38 are routed to the extraction electrodes 37a and 38a described in FIG. 1, respectively. Thus, after the piezoelectric device 30 has been mounted on a mounting substrate or the like, a driving voltage from the external is transmitted from the mounting terminals 41 and 42 via the electrode portions 31 and 31 to the extraction electrodes 37a and 38a of the piezoelectric resonator element 32, so as to be transmitted to the excitation electrodes 37 and 38.

Furthermore, the application of the driving voltage to the excitation electrodes in the longitudinal grooves 33 and 34 can enhance, at the time of driving, the electric field efficiency inside the region, in which the longitudinal grooves are formed, of each resonating arm.

That is, as shown in FIG. 4, each of the excitation electrodes 37 and 38 is coupled to AC power supply by cross wiring, and an AC voltage as a driving voltage is applied from the power supply to the resonating arms 35 and 36.

Thus, the resonating arms 35 and 36 are excited to vibrate with phases opposite to each other, and flexurally vibrate in the fundamental mode, i.e., with the fundamental wave so that the tips of the resonating arms 35 and 36 come close to and move away from each other.

Here, for example, the fundamental wave of the piezoelectric resonator element 32 has the following characteristics: Q value is 12000, capacitance ratio (C0/C1) is 260, CI value is 57 kΩ, and frequency is 32.768 kHz ("kilohertz").

In addition, the second harmonic wave has the following characteristics for example: Q value is 28000, capacitance ratio (C0/C1) is 5100, CI value is 77 kΩ, and frequency is 207 kHz.

Furthermore, preferably, the base portion 51 is provided with, at the edges of the both sides of the base portion 51, recesses or notches 71 that are formed by partially decreasing the width of the substrate 51, as with the resonator element of FIG. 12. The positions of the notches will be described later. Forming the notches 71 in the base portion 51 can significantly reduce leakage of vibration into the base portion 51 due to the flexural vibration of the resonating arms 35 and 36, which can achieve an effect of suppressing the CI value.

In addition, in the piezoelectric resonator element 32, the resonating arms 35 and 36 are formed to have a shape like that shown in FIG. 3. Since the resonating arms have the same shape, description will be made only about the resonating arm 36. The resonating arm 36 has the largest arm width at a base end T extending from the base portion 51. In addition, between the base end T, which is at the root of the resonating arm 36, and a position U spaced from the end T by a slight distance toward the tip of the resonating arm 36, a first width-decreasing part TL whose width sharply decreases from the end T to the position U is formed. Furthermore, a second width-decreasing part is formed whose width gradually and continuously decreases from the position U, which is at an end of the first width-decreasing part TL, further toward the tip of the resonating arm 36 to a position P, i.e., across the distance CL as to the resonating arm. Note that, from the position P of FIG. 3 to the tip of the resonating arm, the arm width may gradually be increased as shown in the drawing, or alternatively the arm width may be almost the same. If the arm width is not changed in the range from the position P to the arm tip, arm weight of this range may be increased by thickening an electrode film (metal cover) on the region, and so on, in an electrode forming step to be described later.

Thus, the resonating arm 36 is provided with the first width-decreasing part TL near the root close to the base portion to thereby have high rigidity. In addition, the second width-decreasing part is formed in a range from the position U of the first width-decreasing part to a position closer to the tip than the position U. Thereby, the rigidity of the resonating arm is continuously reduced. The position P corresponds to a change point P of arm width variation and is a constricted position in terms of the shape of the resonating arm 36. Therefore, the position P can also be expressed as a constricted position P. In the resonating arm 36, in the range from the constricted position P to the tip, the arm width is the same or alternatively the arm width is gradually increased as shown in the drawing.

Here, it has been known that larger longitudinal grooves 33 and 34 of FIG. 3 lead to higher electric field efficiency of the material forming the resonating arms 35 and 36. It has also been known that the CI value of the tuning fork type resonator element is lowered as the length PL of the longitudinal grooves 33 and 34 from the base portion 51 with respect to the total length L of the resonating arm is increased at least until PL/L=about 0.7. In the embodiment, in FIG. 3, the total length L of the resonating arm 36 is about 1250 μm for example.

On the premise of the above configuration, in the embodiment, in FIG. 3, the following relationship is achieved assuming that the total length L of the resonating arm 36 is about 1250 μm for example.

Figure 5:
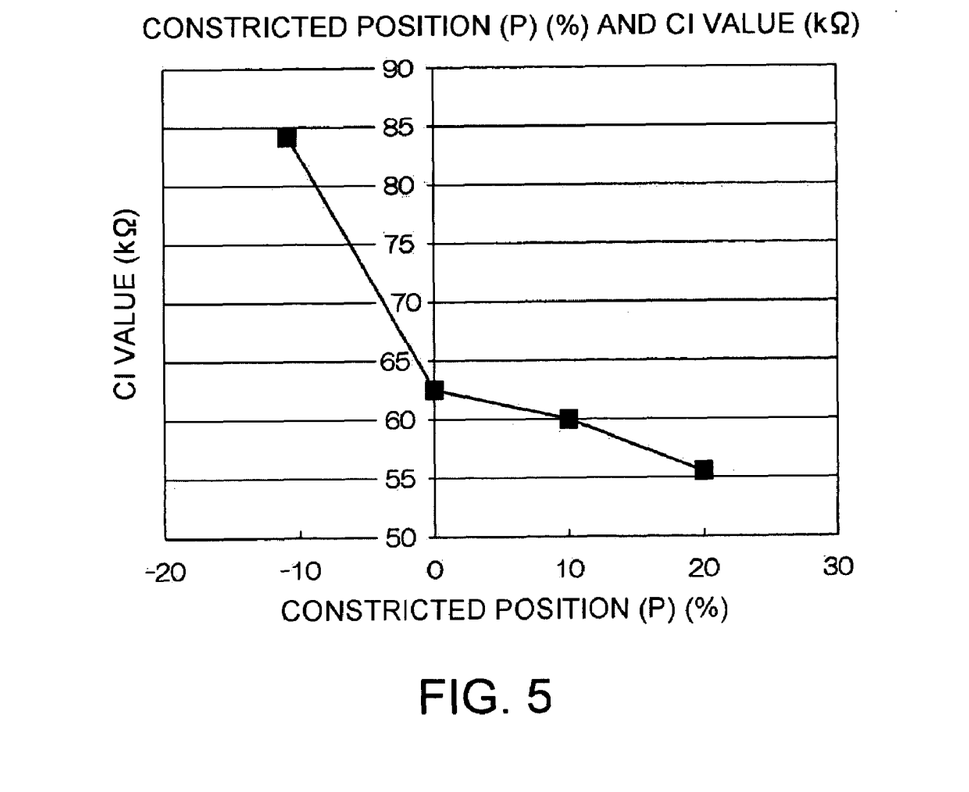
FIG. 5 is a graph illustrating the relationship between constricted positions of a resonating arm and CI values of the piezoelectric resonator element of FIG. 3.

FIG. 5 is a graph plotting on the abscissa the constricted positions P, which are the change points P of arm width variation, and on the ordinate, changes of the CI value of the piezoelectric resonator element 32 depending on the place of the constricted position P as to the longitudinal direction of the resonating arm. The percentages on the abscissa of the graph of FIG. 5 correspond to the ratio of the difference between the length CL from the base portion to the constricted position P and the length PL of the longitudinal groove 34, with respect to the total length L of the resonating arm. The ratio takes a positive value when the length CL is larger than the length PL, i.e., when the constricted position P is closer to the arm tip than the end of the longitudinal groove 34. The position 0% on the abscissa corresponds to the position of the end of the longitudinal groove 34 indicated by the PL of FIG. 3. Specifically, the position 0% indicates that the constricted position (change point) P is located at the position of the end of the longitudinal groove 34.

The CI value is suppressed sufficiently by setting the length PL of the longitudinal groove to an adequate length as describe above. In addition, referring to FIG. 5, it is apparent that the CI value significantly changes depending on which place the constricted position P is located at with respect to the end position of the longitudinal groove. Furthermore, the CI value can be decreased sharply by providing the constricted position (change point of arm width variation) P at a position closer to the tip of the resonating arm than the end of the longitudinal groove.

Figure 6:
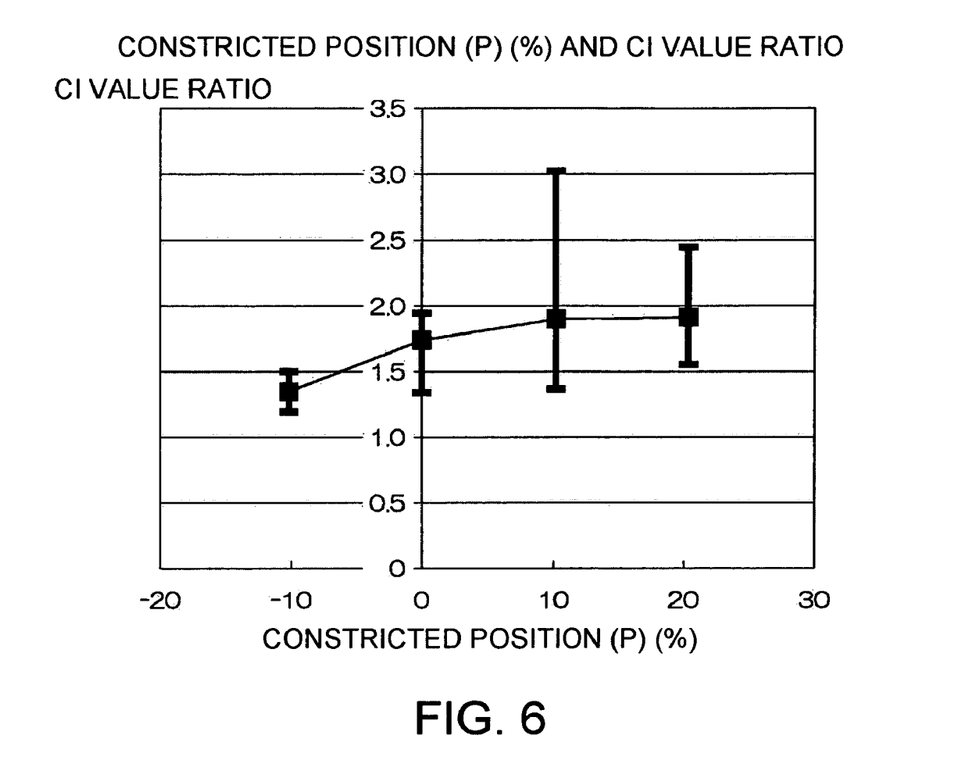
FIG. 6 is a graph illustrating the relationship between constricted positions of the resonating arm and CI value ratios of the piezoelectric resonator element of FIG. 3.

FIG. 6 shows on the abscissa, which place the constricted position P is located at as to the longitudinal direction of the resonating arm, and on the ordinate, changes of the CI value ratio of the piezoelectric resonator element 32 (the ratio of the CI value of a harmonic wave to the CI value of the fundamental wave) depending on the constricted position P. The abscissa of the graph of FIG. 6 is the same as that of FIG. 5. If the CI value ratio is smaller than 1, the CI value of the fundamental wave is larger than the CI value of a harmonic wave, and thus oscillation with the harmonic wave is easily caused.

Referring to FIG. 6, if the length PL of the longitudinal groove is set to an adequate length as described above to thereby sufficiently suppress the CI value, the CI value ratio (the ratio of the CI value of a harmonic wave to the CI value of the fundamental wave) of the piezoelectric resonator element 32 can be maintained at a value larger than 1 even if the constricted position P is displaced to some extent. In addition, the CI value ratio is increased as the constricted position P is brought closer to the tip of the resonating arm, which prevents oscillation with a harmonic wave.

Thus, in the resonating arm 36 of FIG. 3, the longer longitudinal groove 34 results in a lower CI value. Furthermore, by providing the constricted position (change point) P at a position closer to the tip of the resonating arm, the CI value can be reduced while the CI value ratio can be increased. Thus, preferably, by providing the constricted position P at a position closer to the tip of the resonating arm than the end of the longitudinal groove, the CI value ratio can be increased almost surely and thus oscillation with a harmonic wave can be prevented.

Figure 7:
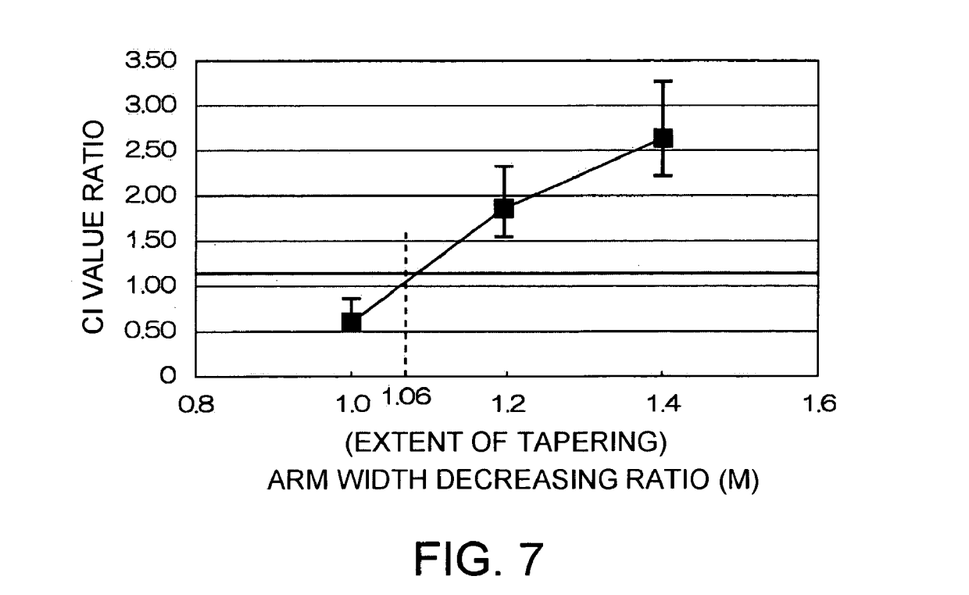
FIG. 7 is a graph illustrating the relationship between arm width decreasing ratios of the resonating arm and CI value ratios of the piezoelectric resonator element of FIG. 3.

In addition, FIG. 7 is a graph in which ratios of the maximum width (W2) to the minimum width (W1) of the resonating arm, which is the arm width decreasing ratio M of the resonating arm 36, are plotted on the abscissa, and CI value ratios are plotted on the ordinate, in the case in which the groove length ratio N, which is the ratio of the length PL of the longitudinal groove 34 of FIG. 3 to the length of the resonating arm 36, is 61.5%.

As shown in the drawing, the larger the arm width decreasing ratio M is, the larger the CI value ratio is, which is preferable. In the embodiment, by setting the arm width decreasing ratio M of the resonating arm 36 larger than 1.06, the CI value ratio can be set larger than 1, and thus oscillation with a harmonic wave can be prevented.

Thus, in the piezoelectric resonator element 32, the ratio of the maximum width to the minimum width as the arm width decreasing ratio M of the resonating arm is determined in relation to the ratio N of the length of the longitudinal groove with respect to the arm length of the resonating arm. Thereby, the piezoelectric resonator element 32 and the piezoelectric device 30 including this can be miniaturized while the CI value can be reduced and oscillation with a harmonic wave can be prevented to thereby allow favorable vibration characteristics.

Figure 8:
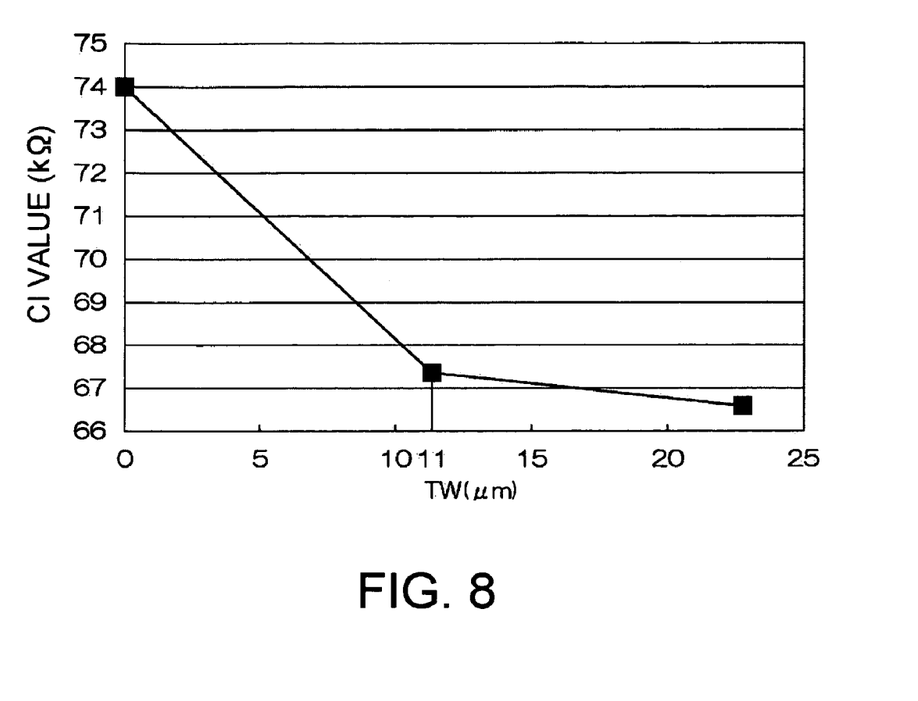
FIG. 8 is a graph illustrating the relationship between widths of a first width-decreasing part and CI values of the piezoelectric resonator element of FIG. 3.

In addition, FIG. 8 illustrates the relationship between the CI value and the width of the first width-decreasing part TL, which is shown in a magnified form on the right side of FIG. 3.

In the drawing, assuming that the length TH of the first width-decreasing part is about 50 µm, changes of the CI value are plotted on the ordinate while the widths TW are plotted on the abscissa.

As shown in the drawing, if the width TW is smaller, the CI value is higher. If the width TW is larger, the strain is smaller and a vibration component of the Z-direction described in FIG. 13 is decreased to stabilize the vibration, which decreases the CI value. As shown in the drawing, in this case, the significant decrease of the CI value is found, from the case in which the width TW is 0, i.e., no first width-decreasing part is formed, to the case of providing the first width-decreasing part and setting the width TW to about 10 µm, and particularly to near 11 µm. In addition, the CI value gradually decreases if the width TW is further increased up to the width of the base portion 51.

As described above, according to the present embodiment, the first width-decreasing part increases the rigidity of the root portion, i.e., the vicinity of the root, of each of the resonating arms 35 and 36 of the piezoelectric resonator element 32. Thus, flexural vibration of the resonating arms can further be stabilized and therefore the CI value can be suppressed. Furthermore, the provision of the second width-decreasing part gradually lowers the rigidity of the resonating arm 36 from the vicinity of the root to the constricted position P. In contrast, in the range from the constricted position P to the tip, the longitudinal groove 34 is absent and the arm width is gradually increased, and therefore the rigidity is increased toward the tip.

Accordingly, it is expected that the "node" of vibration in vibration with the second harmonic wave is located at a position closer to the tip of the resonating arm 36. Thus, even if the longitudinal groove 34 is elongated to enhance the electric field efficiency of the piezoelectric material and decrease the CI value, lowering of the CI value of the second harmonic wave can be prevented while the CI value of the fundamental wave is suppressed. Thus, even if the device is miniaturized, the CI value of the fundamental wave can be suppressed, and therefore a piezoelectric resonator element involving no deterioration of the drive characteristic can be provided.

Next, the preferred detail structure of the piezoelectric resonator element 32 of the present embodiment will be described with reference to FIGS. 3 and 4.

Since the resonating arms 35 and 36 of the piezoelectric resonator element 32 shown in FIG. 3 have the same shape, a respect to be described as to either one of the resonating arms 35 and 36 is a respect common to the both resonating arms.

The wafer thickness x of FIG. 4, i.e., the thickness of the quartz wafer forming the piezoelectric resonator element is preferably 70 µm to 130 µm.

The total length a of the piezoelectric resonator element 32 of FIG. 3 is about 1300 µm to 1600 µm.

The total length b of the resonating arm is 1100 µm to 1400 µm, and is most preferably 1250 µm for the above-described reason.

It is preferable, in terms of miniaturization of a piezoelectric device, that the total width d, which is the base portion width of the piezoelectric device 30, is about 400 µm to 600 µm. In the embodiment, the width d is about 500 µm. Therefore, in order to miniaturize the tuning fork part, the width e of the base portion 51 on the tip side is about 200 µm to 400 µm.

In addition, it is preferable that the distance k between the resonating arms 35 and 36 of FIG. 3 is 50 µm to 100 µm. If the distance k is smaller than 50 µm, when forming the outer shape of the piezoelectric resonator element 32 by processing a quartz wafer by wet-etching as described later, it is difficult to sufficiently reduce the size of an irregularly-shaped part due to etching anisotropy, i.e., a fin-shaped projection indicated by numeral 81 of FIG. 4 projecting toward the positive X-axis direction on a side surface of the resonating arm. If the size k is equal to or larger than 100 µm, the flexural vibration of the resonating arm may become unstable.

Furthermore, in the resonating arm 35 (same as the resonating arm 36) of FIG. 4, the distances m1 and m2 between the outer edges of the longitudinal groove 33 and the outer edges of the resonating arm, are both 3 µm to 15 µm. Setting the distances m1 and m2 equal to or smaller than 15 µm improves the electric field efficiency. Setting them equal to or larger than 3 µm causes an advantage of ensuring the polarization of the electrodes.

In the resonating arm 36 of FIG. 3, it is preferable that the extent of tapering of the tip with respect to the change point P of the arm width is a width increase of about 0-20 µm relative to the width at the change point P, at which the arm width of the resonating arm 36 is the minimum. If the tip is tapered above this extent, the tip of the resonating arm 36 becomes too heavy, which may deteriorate the stability of flexural vibration.

In addition, the irregularly-shaped part 81 projecting in a fin shape toward the positive X-axis direction is formed on one outer side surface of the resonating arm 35 (same as the resonating arm 36) of FIG. 4. This is formed as an etching residue due to etching anisotropy of quartz when forming the outer shape of a piezoelectric resonator element by wet-etching. It is preferable, in terms of achieving stable flexural vibration of the resonating arm 35, to reduce the projection amount v of the irregularly-shaped part 81 within 5 μm by etching the piezoelectric resonator element for 9 to 11 hours with preferably an etchant prepared with a fluorinated acid and ammonium fluoride.

It is preferable that the width g of the longitudinal groove of FIG. 3 is about 60 to 90 percent of the arm width c of the resonating arm in the region in which the longitudinal groove of the resonating arm is formed. Since the first and second width-decreasing parts are formed in the resonating arms 35 and 36, the arm width c differs depending on the position as to the longitudinal direction of the resonating arm, and therefore the width g of the longitudinal groove is about 60 to 90 percent of the maximum width of the resonating arm. If the width of the longitudinal groove is smaller than this, the electric field efficiency is lowered, leading to an increase of the CI value.

Moreover, typically the total length h of the base portion 51 of FIG. 3 is about 30 percent of the total length a of the piezoelectric resonator element 32. However, in the embodiment, the length h can be reduced to about 15 to 25 percent by adopting notches and so on, and thus miniaturization can be realized.

Furthermore, in consideration of the fact that, in flexural vibration of the resonating arms 35 and 36 of the piezoelectric resonator element 32, the region to which the vibration leakage is transmitted correlates with the arm width c of the resonating arm, the present inventors have obtained the knowledge that notches of typical piezoelectric resonator elements are not provided at proper positions. Consequently, the positions at which the notches 71 of FIG. 3 are provided are set to places spaced from the roots of the resonating arms by the distance i that is above the arm width c of the resonating arm. Thus, the notches 71 provide a structure allowing further ensured suppression of transmission of the vibration leakage from the resonating arms 35 and 36 to the base portion. Thus, the vibration leakage from the resonating arms to the base portion can be prevented adequately, and therefore a piezoelectric resonator element having a favorable drive level characteristic can be provided.

In particular, it has been confirmed that the drive level characteristic can be adjusted to the level of a normal piezoelectric resonator element 32 by forming the notches 71 spaced from the position T at the root of the resonating arms 35 and 36 by the distance i that is equal to or larger than 1.2 times the arm width c.

In addition, it is preferable that the positions of ends of the longitudinal grooves 33 and 34, close to the base portion 51, are the same as the positions of the roots of the resonating arms 35 and 36 in FIG. 3, i.e., the position T, or are slightly closer to the tip of the resonating arm than the position T and are within the range in which the first width-decreasing part TL exists. It is particularly preferable that the positions of the ends are not closer to the base end of the base portion 51 than the position T.

Figure 9:
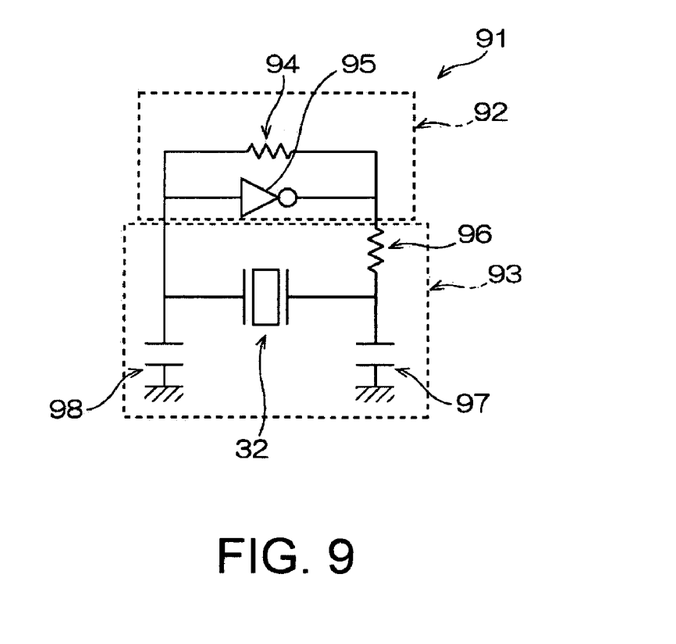
FIG. 9 is a circuit diagram illustrating an example of an oscillation circuit that uses the piezoelectric resonator element of FIG. 1.

FIG. 9 is a circuit diagram illustrating an example of an oscillation circuit for the case in which a piezoelectric oscillator is configured by utilizing the piezoelectric resonator element 32 of the present embodiment.

An oscillation circuit 91 includes an amplification circuit 92 and a feedback circuit 93.

The amplification circuit 92 includes an amplifier 95 and a feedback resistor 94. The feedback circuit 93 includes a drain resistor 96, capacitors 97 and 98 and the piezoelectric resonator element 32.

Here, the resistance of the feedback resistor 94 of FIG. 9 is about 10 MΩ (megaohm) for example, and the amplifier 95 can use a CMOS inverter. The resistance of the drain resistor 96 can be 200 to 900 kΩ (kiloohm) for example. The capacitances of the capacitor 97 (drain capacitance) and the capacitor 98 (gate capacitance) can be 10 and 22 pF (picofarad), respectively.

Method of Manufacturing Piezoelectric Device

Figure 10:
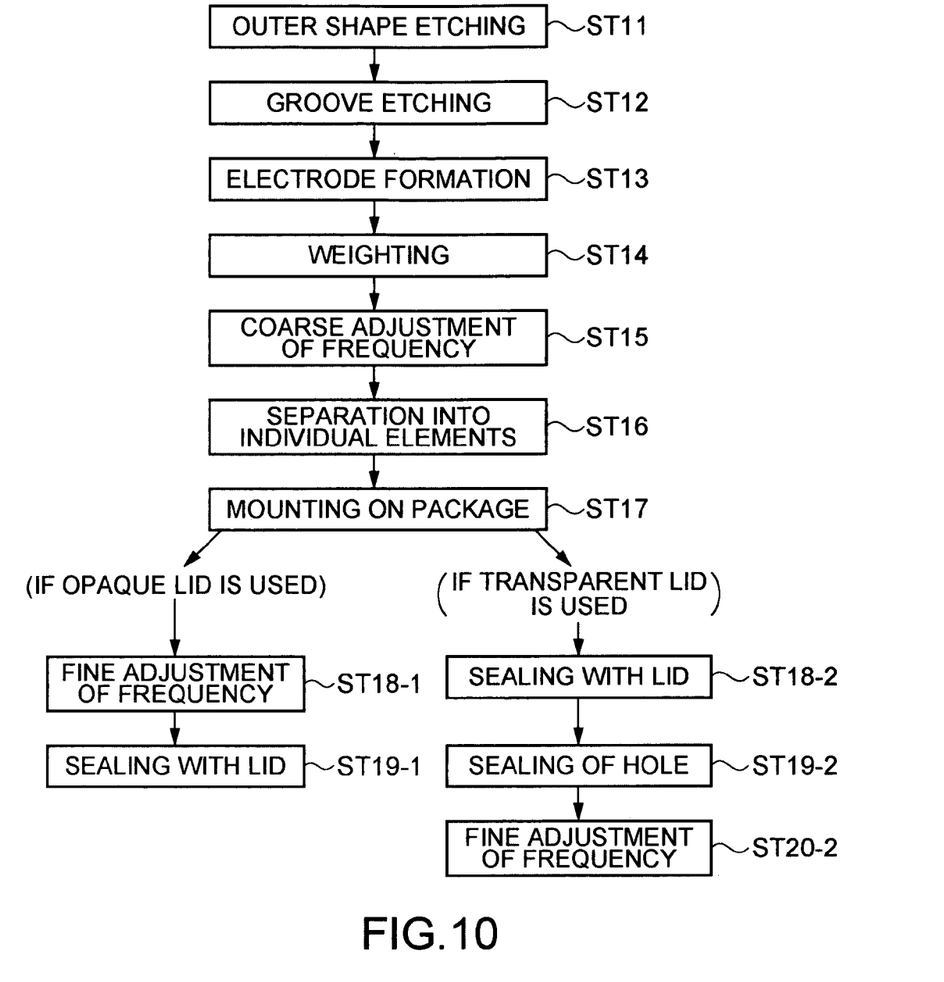
FIG. 10 is a flowchart illustrating one example of a manufacturing method of the piezoelectric device of FIG. 1.

Referring to the flowchart of FIG. 10, one example of a manufacturing method of the above-described piezoelectric device will be described.

The piezoelectric resonator element 32 of the piezoelectric device 30, the package 57 and the lid 40 are manufactured independently of each other.

Manufacturing Method of Lid and Package

The lid 40 is prepared as a lid having a size suitable for sealing the package 57 by cutting a glass plate (for example, borosilicate glass) having a certain size, for example.

The package 57 is formed by stacking plural substrates that are formed by forming ceramic green sheets made of aluminum oxide and then sintering them as descried above. In the forming, a certain hole is formed inside each of the plural substrates. Thereby, when the substrates are stacked, a certain internal space S is formed inside thereof.

Manufacturing Method of Piezoelectric Resonator Element

Initially a piezoelectric substrate is prepared, and the outer shapes of a certain number of piezoelectric resonator elements are simultaneously formed by etching from one piezoelectric substrate (outer shape etching).

Figure 11:
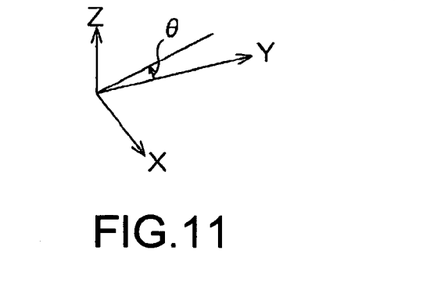
FIG. 11 is a diagram illustrating coordinate axes for a quartz Z-cut plate.

Here, as the piezoelectric substrate, of piezoelectric materials, a quartz wafer is used having such a size that a plurality of or a number of piezoelectric resonator elements 32 can be separated therefrom, for example. Since this piezoelectric substrate forms the piezoelectric resonator element 32 of FIG. 3 along with the progress of steps, the piezoelectric substrate is cut from a piezoelectric material, e.g., quartz single crystal so that the X-axis, Y-axis and Z-axis shown in FIG. 3 correspond to the electric axis, mechanical axis and optical axis, respectively. In addition, the piezoelectric substrate is obtained by cutting and polishing a quartz Z-cut plate to a certain thickness. The quartz Z-cut plate is obtained by, in the cutting from quartz single crystal, rotating the quartz single crystal clockwise in an orthogonal coordinate system composed of the above-described X-axis, Y-axis and Z-axis about the Z-axis by an angle in the range of 0 to 5 degrees (θ of FIG. 11) and then cutting it.

In the outer shape etching, by using a mask, such as a corrosion-resistant film, not shown in the drawing, for removing exposed part of the piezoelectric substrate outside from the outer shape of the piezoelectric resonator element, etching for the outer shape of the piezoelectric resonator element is carried out with using a fluorinated acid solution as an etchant for example. As the corrosion-resistant film, a metal film in which gold is vapor deposited on chromium as a base layer can be used for example. This etching process is wet-etching, and depends on the concentration, kind, temperature and so on of the fluorinated acid solution.

Here, in the wet-etching of the outer shape etching step, as to the electric axis X, mechanical axis Y and optical axis Z shown in FIG. 3, the following etching anisotropy is exhibited along with the progress of the etching.

That is, regarding the etching rate in the X-Y plane about the piezoelectric resonator element 32, as to the positive X direction, etching progresses fast in the planes along directions at an angle of 120 degrees and an angle of minus 120 degrees with respect to the X-axis. As to the negative X direction, etching progresses slowly in the planes along directions at an angle of plus 30 degrees and an angle of minus 30 degrees with respect to the X-axis.

Similarly, regarding the progress of the etching of the Y-direction, etching progresses fast in the plus 30 degrees direction and minus 30 degrees direction. For the positive Y-direction, etching progresses slow in the directions at an angle of plus 120 degrees and an angle of minus 120 degrees with respect to the Y-axis.

Due to such anisotropy in the progress of etching, in the piezoelectric resonator element 32, an irregularly-shaped part projecting in a fin shape is formed on an outer side surface of each resonating arm as indicated by numeral 81 of FIG. 4.

However, in this embodiment, the etching is implemented with using a fluorinated acid and ammonium fluoride as an etchant for a sufficient time period, i.e., 9 to 11 hours. Thereby, the size of the irregularly-shaped part 81 described in FIG. 4 can be extremely decreased (ST11).

In the step, the outer shape of the piezoelectric resonator element 32 including the notches 71 is formed, and at the completion of the step, a number of piezoelectric resonator elements 32 in an outer shape completed state are obtained in which the vicinities of the base portions 51 are coupled via thin coupling parts to the quartz wafer.

Half Etching Step for Forming Grooves

Subsequently, with resist for forming grooves not shown in the drawing, in order to obtain the configuration shown in FIG. 4, the corrosion-resistant film is left on part in which the grooves are not to be formed so that the both side walls sandwiching each longitudinal groove are left. The front and back surfaces of each of the resonating arms 35 and 36 are then wet-etched with the same etching conditions as those of the outer shape etching to thereby form bottom parts corresponding to the longitudinal grooves (ST12).

Here, referring to FIG. 4, the groove depth t is about 30 to 45 percent of the total thickness x. If the groove depth t is equal to or smaller than 30 percent of the total thickness x, there may be a case in which the electric field efficiency cannot be enhanced sufficiently. If the groove depth t is equal to or larger than 45 percent, there may be a case in which the rigidity is insufficient, which has adverse effects on flexural vibration and leads to insufficient strength.

Note that either or simultaneously both of the outer shape etching and groove etching may be formed by dry-etching. In this case, for example, for each etching, a metal mask is deposited on the piezoelectric substrate (quartz wafer) to cover a region corresponding to the outer shape of the piezoelectric resonator element 32, and after the outer shape has been formed, to cover a region corresponding to the longitudinal grooves. In this state, for example, the piezoelectric substrate is loaded in a chamber not show in the drawing and an etching gas is supplied with a certain vacuum to generate etching plasma, which allows the dry-etching. That is, connected to the vacuum chamber (not shown in the drawing) are a freon gas cylinder and an oxygen gas cylinder. Furthermore, the vacuum chamber is provided with an exhaust pipe and thereby is evacuated to a certain vacuum.

The inside of the vacuum chamber is evacuated to a certain vacuum and a freon gas and an oxygen gas are delivered to the chamber. When a DC voltage is applied after the mixture gas has been delivered to a certain air pressure, plasma is generated. The mixture gas including ionized particles impinges on the piezoelectric material exposed from the metal mask. Due to this impingement, the piezoelectric material is physically removed and scatters, and thus the etching progresses.

Electrode Forming Step

Next, the entire surface of the piezoelectric substrate is covered with a metal, e.g., gold, to serve as electrodes by vapor deposition, sputtering or the like. Subsequently, with using resist for exposing regions in which the electrodes are not to be formed, the electrodes for driving described in FIGS. 1 and 4 are formed by photolithography (ST13).

Thereafter, on the tips of the resonating arms 35 and 36, weighting electrodes (metal coating) 21 are formed by sputtering or vapor deposition (refer to FIG. 3) (ST14). The weighting electrodes 21 are not energized for driving the piezoelectric resonator element 32 but utilized for frequency adjustment to be described later.

Subsequently, on the wafer, coarse adjustment of the frequency is carried out (ST15). The coarse adjustment is based on a mass reduction method in which part of the weighting electrodes 21 is irradiated with an energy beam such as laser light to thereby be partly evaporated.

Subsequently, the above-described thin coupling parts coupled to the wafer are broken off to turn the wafer to individual pieces for separately forming the piezoelectric resonator elements 32 (ST16).

Next, as described for FIG. 1, the conductive adhesives 43 are applied on the electrode portions 31 of the package 57, and the extraction electrodes 37a and 38a of the base portion 51 of the piezoelectric resonator element 32 are disposed on the conductive adhesives 43. The adhesives are then heated and cured to thereby bond the piezoelectric resonator element 32 to the package 57 (ST17).

Here, the conductive adhesive 43 is, for example, a substance that is obtained by mixing conductive particles such as silver particles into a binder component employing synthetic resin or the like, and allows mechanical bonding and electric coupling simultaneously.

Subsequently, if the lid 40 is formed of an opaque material such as a metal, the through hole 27 described in FIG. 2 is not provided. Therefore, prior to the bonding of the lid 40, frequency adjustment as fine adjustment is implemented by a mass reduction method by, with applying a driving voltage to the piezoelectric resonator element 32 and observing the frequency, radiating laser light to the tips of the weighting electrodes 21 of the resonating arm 35 and/or the resonating arm 36 of the piezoelectric resonator element 32, for example (ST18-1).

Subsequently, the lid 40 is bonded to the package 57 by seam welding (ST19-1), and then through necessary checks, the piezoelectric device 30 is completed.

Alternatively, if the package 57 is sealed with a transparent lid 40, the lid 40 is bonded to the package 57 after the bonding of the piezoelectric resonator element 32 in ST17 (ST18-2).

In this case, for example, a step of heating low-melting glass to bond the lid 40 to the package 57 is implemented. In this heating, a gas is generated from the low-melting glass and the conductive adhesive. Thus, by heating, such a gas is discharged from the through hole 27 described in FIG. 2 (degassing). Thereafter, a metal sphere or pellet made of gold tin, more preferably gold germanium, or the like is disposed on a step 29 and then is irradiated with laser light or the like to be melted. Thus, the metal filling material 28 of FIG. 2 hermetically seals the through hole 27 (ST19-2).

Subsequently, as shown in FIG. 2, laser light from the external is transmitted through the transparent lid 40 made of borosilicate glass or the like to be radiated to the tips of the weighting electrodes 21 of the resonating arm 35 and/or the resonating arm 36 of the piezoelectric resonator element 32, to thereby implement frequency adjustment as fine adjustment by a mass reduction method (ST20-2). Subsequently, through necessary checks, the piezoelectric device 30 is completed.

The present invention is not limited to the above-described embodiments. The configurations of the embodiments may be adequately combined to each other, or alternatively part thereof may be omitted and the resultant configuration may be combined with another configuration not shown in the drawing.

In addition, the invention is not limited to a device in which a piezoelectric resonator element is housed in a box-shaped package. The invention can be applied to a device in which a piezoelectric resonator element is housed in a cylinder-shaped container, and a device in which a piezoelectric resonator element functions as a gyro sensor. Furthermore, the invention can be applied to any piezoelectric device employing a piezoelectric resonator element irrespective of the device name such as a piezoelectric resonator and a piezoelectric oscillator.

What is claimed is:

1. A piezoelectric resonator element comprising:
    a base portion formed of a piezoelectric material;
    a plurality of resonating arms formed integrally with the base portion and extending parallel to each other;
    a longitudinal groove formed along a longitudinal direction of each of the resonating arms;
    an electrode for driving formed in the longitudinal grove; and
    a change point located closer to a tip of the resonating arm than is a tip of the longitudinal groove, wherein:
    each of the resonating arms includes a gradually decreasing width in a range from the base portion to the change point and at least one of the same width and an increasing width from the change point to the tip of the resonating arm.

2. The piezoelectric resonator element according to claim 1, wherein each of the resonating arms includes:
    a first width-decreasing part, near a root of the resonating arm to the base portion, in which the width of the resonating arm is sharply decreased from the root toward the tip of the resonating arm; and
    a second width-decreasing part in which the width of the resonating arm is gradually decreased from an end of the first width-decreasing part toward the tip of the resonating arm.

3. The piezoelectric resonator element according to claim 2, wherein a width of the first width-decreasing part is equal to or larger than 11 μm.

4. The piezoelectric resonator element according to claim 1, wherein the base portion has a notch formed by decreasing a width of part of the piezoelectric material.

5. The piezoelectric resonator element according to claim 1, wherein an irregularly-shaped part projecting toward a positive X-axis (electric axis) direction is formed on a side surface of each of the resonating arms so that a size of the irregularly-shaped part is minimized.

6. The piezoelectric resonator element according to claim 1, wherein a ratio of a maximum width of the resonating arm to a minimum width of the resonating arm, as an arm width decreasing ratio of the resonating arm, is determined in relation to a ratio of a length of the longitudinal groove to an arm length of the resonating arm, as a groove length ratio.

7. The piezoelectric resonator element according to claim 6, wherein if the groove length ratio is set to about 61 percent, the arm width decreasing ratio is set equal to or larger than 1.06.

8. A piezoelectric device housing a piezoelectric resonator element in a package or a case, the piezoelectric resonator element comprising:
    a base portion formed of a piezoelectric material;
    a plurality of resonating arms formed integrally with the base portion and extending parallel to each other;
    a longitudinal groove formed along a longitudinal direction of each of the resonating arms;
    an electrode for driving formed in the longitudinal groove; and
    a change point located closer to a tip of the resonating arm than is a tip of the longitudinal groove, wherein:
    each of the resonating arms includes a gradually decreasing width in a range from the base portion to the change point and at least one of the same width and an increasing width to the tip of the resonating arm.

* * * * *

UNITED STATES PATENT AND TRADEMARK OFFICE
CERTIFICATE OF CORRECTION

| | | |
|---|---|---|
| PATENT NO. | : 7,368,861 B2 | Page 1 of 1 |
| APPLICATION NO. | : 11/234741 | |
| DATED | : May 6, 2008 | |
| INVENTOR(S) | : Hideo Tanaya | |

It is certified that error appears in the above-identified patent and that said Letters Patent is hereby corrected as shown below:

Col. 15, Line 36                      "grove" should be --groove--

Signed and Sealed this
Nineteenth Day of March, 2013

Teresa Stanek Rea
*Acting Director of the United States Patent and Trademark Office*